United States Patent [19]
Salt et al.

[11] Patent Number: 5,351,216
[45] Date of Patent: Sep. 27, 1994

[54] PREMATURE TERMINATION OF MICROCONTROLLER EEPROM WRITE

[75] Inventors: Tom Salt, Chandler; Rodney Drake, Mesa; Ray Allen, Mesa, all of Ariz.

[73] Assignee: Microchip Technology Incorporated, Chandler, Ariz.

[21] Appl. No.: 26,908

[22] Filed: Mar. 5, 1993

[51] Int. Cl.$^5$ .............................................. G06K 5/00
[52] U.S. Cl. ........................... 365/230.01; 364/483; 364/228; 395/425; 371/15.1; 371/29.1
[58] Field of Search ........................... 365/230.01, 228; 235/380, 487; 364/483, 228; 395/425; 371/15.1, 29.1

[56] References Cited

U.S. PATENT DOCUMENTS

| | | | |
|---|---|---|---|
| 4,467,434 | 8/1984 | Hurley et al. | 364/483 |
| 4,734,568 | 3/1988 | Watanabe | 235/487 |
| 4,798,941 | 1/1989 | Watanabe | 235/380 |
| 4,813,024 | 3/1989 | Lisimague et al. | 365/207 |

FOREIGN PATENT DOCUMENTS 63-175272  7/1988  Japan .

*Primary Examiner*—Viet Q. Nguyen
*Attorney, Agent, or Firm*—O'Connor, Cavanagh

[57] ABSTRACT

A single chip, semiconductor microcontroller device is adapted to control an aspect of the operation of an external system. The device includes a CPU, program memory for storing instructions to be selectively executed by the CPU to perform the control functions, and peripheral EEPROM data memory adapted to be written to for storing selected data in selected ones of a multiplicity of addresses of the data memory and for selective retrieval of the stored dam by the CPU within its control function. Internal logic in the device is implemented to abort a write operation in progress on the EEPROM data memory upon occurrence of an asynchronous reset of the device. An error flag is set by the logic to indicate that the write operation is being aborted, and the data that was partially written to the EEPROM memory at the time the write operation was aborted is held intact.

7 Claims, 1 Drawing Sheet

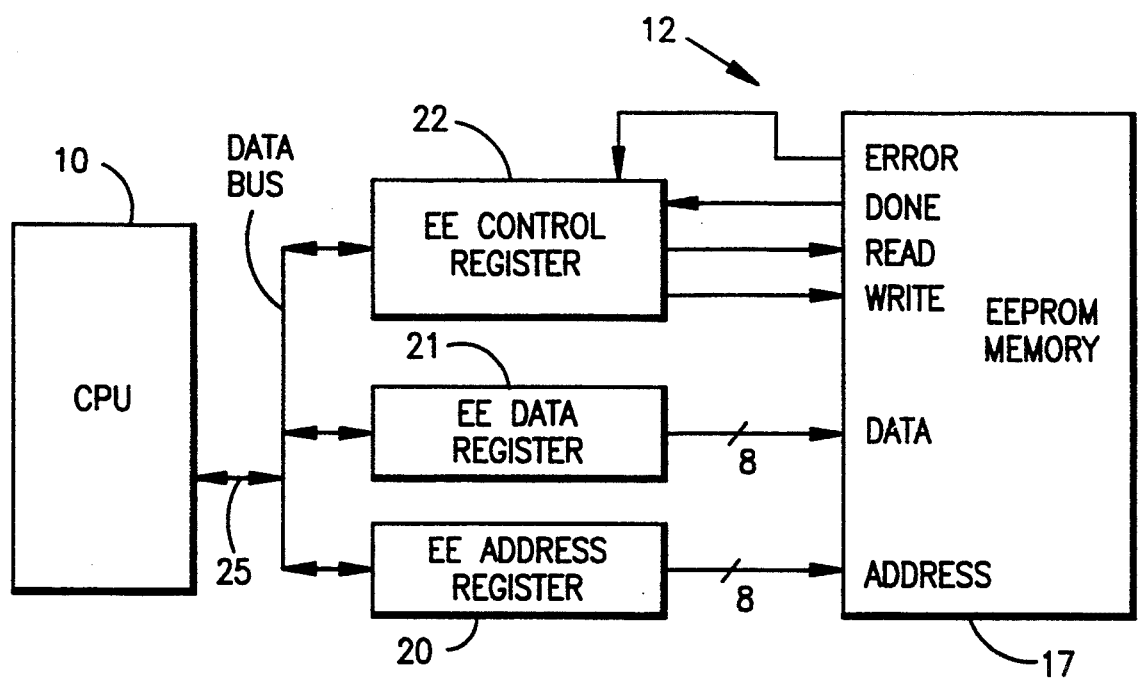
FIG. 2
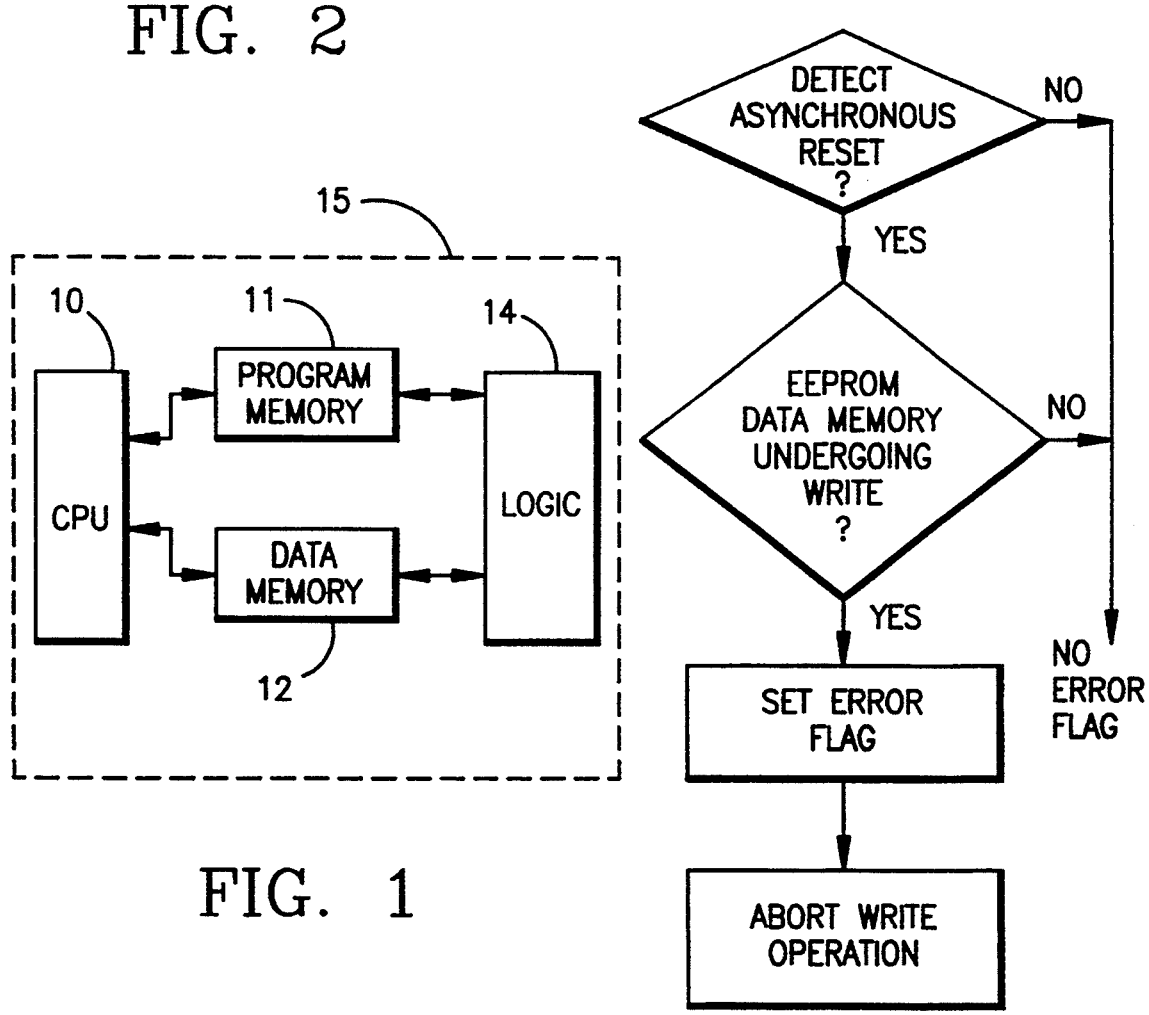
FIG. 1
FIG. 3

PREMATURE TERMINATION OF MICROCONTROLLER EEPROM WRITE

BACKGROUND OF THE INVENTION

The present invention relates generally to semiconductor microprocessors, a class of which known as microcontrollers perform selective control functions, and more particularly to a programmable microcontroller with enhanced memory capacity.

The evolution of microprocessors into complex instruments and machines has led to sophisticated, fast real-time control capability. Large microprocessors of 16 or 32 bit capability with associated interrupt handler chips, programmable timer chips, ROM and RAM chips, have been replaced in many control function instances by single chip lo microcontrollers with all peripherals embedded on the same chip with the microcontroller. Operation of the chip in an expanded mode enhances the versatility of all on-chip features.

Microcontrollers have a wide diversity of applications. In hand-held devices such as pocket pagers (beepers), the microcontroller is responsive to received characters to interpret them, produce an audible or vibratory signal to notify the user of an incoming message, and produce multiple alphanumeric messages on a suitable display such as an LCD. The microcontroller can recall from its internal memory any or all of the messages received in a given period of time. Among other instrumentation uses are those as meters and testers, capable of carrying out thousands of tests, each in a millisecond or less.

Other applications include keyboard controllers for personal computers, in which the microcontroller serves to offload many tasks formerly handled by the processor, including continuous performance of numerous diagnostic procedures and notification to the processor if a problem is detected. Personal computer applications of microcontrollers include use in modems for command interpretation and data transmission, in printer buffers for high speed dumping of data in preparation for driving the printer at the appropriate speed, and in color plotters, copiers, electronic typewriters/word processors, cable television terminal equipment, lawn sprinkling controllers, credit card phone equipment, cellular telephones, fax machines, automotive applications such as engine control modules, anti-lock braking systems, automobile suspension control, keyless entry systems, and a host of other industrial and consumer applications.

Typically, a microcontroller includes, among other things, a CPU (central processing unit), a program memory from which the CPU fetches instructions, and a data memory (also called a register file in some architectures) which is readable and writable directly by the CPU. The CPU fetches an instruction from the program memory and addresses the data memory according to an address obtained through the instruction or through an indirect register. The CPU may also operate in conjunction with certain peripherals to perform the control function, including devices such as timers, signal ports, and baud rate generators, among others.

Several addressing modes are common once the instruction is fetched. In some instances an embedded address tells the CPU which data memory location to modify with the current operation. This is a standard architecture for a microcontroller with on board (on chip) memory.

In copending U.S. patent application Ser. No. 08/026,968, filed on the same date as this application and assigned to the same assignee (hereinafter referred to as "the '968 application"), the problem of embedding an addressable memory within the microcontroller is considered. Typically, limited memory space is available in the microcontroller device, and much of it may be devoted to static RAM for scratch pad operation or register file use, or to special function registers such as I/O ports, timer and counters in the form of readable and writable registers mapped into the data memory space.

As disclosed in the '968 application, nonvolatile memory in the form lo of electrically erasable (alterable) programmable read only memory (EEPROM) is embedded as additional memory. However, EEPROMs have a very long write cycle (typically, 10 milliseconds) compared to the write cycle of static RAM (typically, 200 nanoseconds), which would necessitate overly long periods of inactivity by the CPU while each write operation is being performed in the EEPROM. In each instance, the CPU would wait for the write to be completed before it could fetch the next instruction or take the next step. To obviate this problem, according to the '968 application, EEPROM is embedded as peripheral data memory on the microcontroller chip, with its own address register and data register mapped as peripheral registers or special function registers within the normal data memory space.

Consequently, the CPU may initiate a write operation of the EEPROM via a control register, after the desired address has been written to the address register and the selected data for that address has been written to the data register. While this write operation is taking place in the peripheral EEPROM the CPU is released to execute other instructions, which is a distinct advantage, but the CPU is effectively oblivious to whatever is occurring in the write operations. That is, the processor is aware that a write operation was commenced, but not of the eruption of a problem during that operation. Left unattended, the EEPROM could have corrupted data written to it, which might deleteriously affect the intended operation of the microcontroller, and worse, possibly cause irreparable damage to the external system being controlled by the microcontroller.

Accordingly, it is a principal object of the present invention to provide a technique for detecting the writing of potentially corrupted data in the peripheral data memory, particularly EEPROM, of a microcontroller device.

SUMMARY OF THE INVENTION

Briefly, according to the present invention the processor (CPU) of the microcontroller is prevented from continuing to operate in the presence of corrupted data having potentially been written to the peripheral EEPROM data memory. To that end, an error flag is raised if a reset occurs during a write operation of the memory.

While a write operation is taking place, it may happen that either a master clear reset or a watchdog timer timeout occurs. A master clear reset is an external asynchronous reset which may arise from an undesired incident external to the microcontroller device, whereas a watchdog timer timeout indicates an internal problem, such as faulty operation of the CPU resulting in a failure to reset the watchdog timer as it should have, producing an internal asynchronous reset. In either case, the asynchronous reset causes the microcontroller device system to re-initialize itself.

The fact that the system has been reset is itself an indication of a potential problem. Nevertheless, the system may be arranged and adapted to simply recommence operations following a reset. With an EEPROM data memory, however, the long write cycle opens the greater probability of corruption of the data that was being written when the reset occurred. An issue created by this event is whether to retain that data in the EEPROM.

By setting a bit as a flag when a reset occurs during a write operation of the EEPROM memory, the existence of a problem is indicated. In one scheme according to the invention, whenever an asynchronous reset is experienced during normal operation of the microcontroller while a write operation of the EEPROM memory is in progress, the write is simply aborted. Alternatively, the data may be stored on the premise that it may not have been corrupted. However, despite the likelihood in the case of EEPROM memory that the reset has either corrupted the data or caused it to be only partially written, the write operation is halted, the error flag is set, and the user can evaluate the situation and determine the proper recovery sequence.

An important advantage of the invention is that the CPU is made aware of the potential corruption or partial write, its location in memory, the fact that the data in question has been only partly stored (or discarded), the point in the system operation at which the problem occurred, and the need to examine and correct the problem. This is particularly advantageous as a safety feature where the microcontroller is being used for repetitive control functions on an inherently critical external system, such as an anti-lock braking system.

The specific manner in which this flagged potential problem is dealt with depends on the nature of the controlled system and the preference of the user (i.e., the OEM — original equipment manufacturer in whose system the device is being used). For example, the solution may be simply to restart a write of the data that was being written when the reset occurred. Alternatively, the source of the problem that caused the asynchronous reset may be investigated with many specific clues as indicated above, to determine, for example, whether an adjustment is necessary. If the partially written, flagged data is held stored in a data register associated with the EEPROM, rather than erased, it can also be examined independently to aid the investigation.

If the asynchronous reset occurs at a time other than while a write operation is being performed on the EEPROM, no error flag is set. Rather, the microcontroller system is merely re-initialized, and commences operation at that point.

Therefore, a more specific object of the invention is to provide, in a microcontroller device having EEPROM as a peripheral on-chip memory, a method and structure for setting an error flag when an asynchronous reset occurs while a write of the EEPROM is in progress.

BRIEF DESCRIPTION OF THE DRAWINGS

The above and other objects, features and advantages of the invention will become clear from the following detailed description of the best mode presently contemplated for practicing the invention, with reference to the accompanying drawings in which:

FIG. 1 is a simplified block diagram of a single chip on which the microcontroller CPU, program memory, EEPROM data memory, and associated logic are fabricated;

FIG. 2 is a more detailed block diagram of the peripheral EEPROM data memory and its associated registers in conjunction with the CPU; and FIG. 3 is a flow diagram of the process performed by the logic, by which an error flag is set if an asynchronous reset occurs while a write of the EEPROM memory is in progress.

DETAILED DESCRIPTION OF THE PREFERRED EMBODIMENT AND METHOD

In FIG. 1, a microcontroller CPU 10 is associated and interacts with a program memory 11 in which instructions are stored. The CPU fetches instructions from the program memory for execution during operation of the microcontroller device. Data resulting from the operation, by which an external system (not shown) is controlled, is written by the CPU to selected address locations of a data memory 12 which also contains data previously loaded for control purposes. Logic 14 for programming and other purposes to be described below is arranged and adapted to interact with the memories and the CPU. The various components are fabricated as part of the microcontroller device in a single semiconductor integrated circuit chip 15 by known wafer fabrication process technology.

Referring to FIG. 2, the data memory 12 comprises a peripheral EEPROM 17 with associated address register 20, data register 21 and control register 22 mapped as peripheral registers within the data memory space of the microcontroller device. The three registers are connected for bilateral transfer to the CPU 10 by a data bus 25. Control register 22 has several lines to the EEPROM memory 17 to control write and read operations and acquire completion and error information.

When the EEPROM is to be written to, the designated address is loaded into the address register, and the selected data is entered into the data register. The CPU then sets a write bit in the control register to initiate a write into the memory. As pointed out above, the write operation is time consuming, but by using peripheral EEPROM memory and registers mapped into the data memory space of the microcontroller, the CPU may execute other instructions while the EEPROM is being written to.

As illustrated by the flow diagram of FIG. 3, according to the invention the microcontroller logic (14, FIG. 1) is implemented to set an error flag upon detection of a reset during a write. That is, if a write operation is being performed on the EEPROM data memory and the device logic detects an asynchronous reset, the error flag is set to denote the existence of a problem. Upon setting of the error flag, the write operation is aborted by the logic. The data that was in process of being written at the time, and which at that point is typically only partially written, is held intact.

At that same time, it may be desired to simply halt the activity of the CPU, and logic or a program may be readily implemented to achieve that. Preferably, however, the microcontroller is re-initialized and operation commences with another write of the desired data which had been interrupted, while the CPU resumes its activity from that point. Again, the determination of the precise action to be taken when an error flag is set depends on the desire of the OEM in contemplation of the needs of the users of its system.

If no asynchronous reset is detected while the write operation is in progress, no error flag is set.

A preferred embodiment constituting the best mode presently contemplated for practicing the invention has been described. However, it will be apparent to those skilled in the art that modifications may be made without departing from the true spirit and scope of the invention. Accordingly, it is intended that the invention shall be limited only as required by the appended claims and the rules and principles of applicable law.

What is claimed is:

1. A semiconductor microcontroller device fabricated in a single integrated circuit chip for controlling the operation of an external system, comprising:

a central processing unit (CPU), a program memory adapted to store instructions for execution by the CPU to control the operation of said external system, an electrically erasable programmable read only memory (EEPROM) adapted to be written to during a write cycle for temporarily storing data in predetermined address locations for selective retrieval by the CPU in conjunction with the control function of the CPU, logic means for setting an error flag whenever an asynchronous reset of the device occurs while the EEPROM is being written to, and means responsive to an asynchronous reset of the device for re-initializing execution of instructions by the CPU, the CPU including means for evaluating conditions at a point during execution at which the reset occurred as designated by the error flag to determine disposition of the temporary data that was written to the EEPROM up to that point in the write cycle.

2. The device of claim 1, wherein said means responsive to asynchronous reset includes:

means for aborting the write operation in progress on the EEPROM upon said re-initialization.

3. The device of claim 2, wherein said means for evaluating includes:

means responsive to a determination that data written to the EEPROM up to said point is not corrupted, for retaining such data and writing remaining data to the EEPROM commencing at that point in the write cycle upon said re-initialization.

4. A process of operating a semiconductor microcontroller device fabricated in a single integrated circuit chip for controlling the operation of an external system, the device including a CPU, a program memory adapted to store instructions for execution by the CPU to control the operation of said external system, and an EEPROM data memory adapted to be written to during a write cycle for temporarily storing data in predetermined address locations for selective retrieval by the CPU in conjunction with the control function of the CPU, the process comprising the device-implemented steps of:

detecting the occurrence of an asynchronous reset of the device while the EEPROM memory is undergoing a write operation, setting an error flag upon detection of said asynchronous reset during the write to the EEPROM memory, re-initializing execution of instructions by the CPU upon detection of said asynchronous reset, and evaluating conditions at a point during execution at which the reset occurred as designated by the error flag to determine disposition of data that was written to the EEPROM memory up to that point in the write cycle.

5. The process of claim 4, further including the device-implemented step of:

aborting the write in progress to the EEPROM memory upon said re-initialization.

6. The process of claim 5, further including the device-implemented step of:

determining whether data written to the EEPROM memory up to said point is corrupted, and, if it is not, retaining such data and writing remaining data to the EEPROM memory commencing at that point in the write cycle upon said reinitialization.

7. The process of claim 5, including the device-implemented step of:

determining whether data written to the EEPROM memory up to said point is corrupted, and, if it is, writing completely new data to the EEPROM memory upon said re-initialization.

* * * * *